United States Patent [19]

Compton

[11] Patent Number: 4,616,180

[45] Date of Patent: Oct. 7, 1986

[54] NUCLEAR MAGNETIC RESONANCE IMAGING WITH REDUCED SENSITIVITY TO MOTIONAL EFFECTS

[75] Inventor: Russell A. Compton, Chesterland, Ohio

[73] Assignee: Technicare Corporation, Solon, Ohio

[21] Appl. No.: 551,245

[22] Filed: Nov. 14, 1983

[51] Int. Cl.$^4$ .............................................. G01V 3/00
[52] U.S. Cl. ................................................ 324/309
[58] Field of Search ........................ 324/306, 307, 309

[56] References Cited

U.S. PATENT DOCUMENTS

| | | | |
|---|---|---|---|
| 4,021,726 | 3/1977 | Garroway | 324/309 |
| 4,115,730 | 9/1978 | Mansfield | 324/309 |
| 4,318,043 | 3/1982 | Crooks | 324/309 |
| 4,506,075 | 3/1985 | Moran | 324/309 |

OTHER PUBLICATIONS

"A Flow Velocity Zeugmatographic Interlace for NMR Imaging in Humans", Moran Journal of Magnetic Resonance vol. 1, pp. 197-203, (1983).

"NMR Diffusion and Flow Measurements and an Introduction to Phase Graphing", Singer Institute of Physics, 1978.

*Primary Examiner*—Reinhard J. Eisenzopf
*Assistant Examiner*—G. Peterkin
*Attorney, Agent, or Firm*—W. Brinton Yorks, Jr.

[57] ABSTRACT

The effects of motion in a given direction of particles being imaged in an NMR imaging system are substantially reduced by using gradients in the given direction produced by gradient pulse sequences which exhibit a zero value first moment relative to the point in time at which phase determination of the particles occurs. This point in time is generally taken at the time at which the longitudinal magnetization is translated to the transverse plane, as that is the phase reference for the NMR signals produced by the particles.

12 Claims, 3 Drawing Figures

NUCLEAR MAGNETIC RESONANCE IMAGING WITH REDUCED SENSITIVITY TO MOTIONAL EFFECTS

This invention relates to imaging systems which measure characteristics of materials using nuclear magnetic resonance (NMR) and in particular, to techniques for reducing the sensitivity of such images to the effects of motion within the sample being imaged.

The source of nuclear motion could be voluntary acts such as the physical translation of an object such as a patient moving an arm or leg. It could also be involuntary acts, such as movement of the chest during breathing or the flow of blood or other fluids.

The NMR phenomenon may be employed to form images representing various characteristics of materials. The sample which is to be imaged is placed in a magnetic field Bo, whereby a statistically significant fraction of atomic nuclei align themselves with the magnetic field. This field is disturbed in a controlled manner by magnetic field gradients, which provide spatial encoding, and by excitation signals which disturb the nuclei from their equilibrium alignment. When the excitation signals are terminated, the nuclei begin to return to their original alignment, and generate detectable NMR signals in the process. The detected NMR signals, which bear spatial encoding characteristics, are then processed to produce an image, typically of a plane of planes of the sample being imaged.

The NMR phenomenon is presently being applied in systems which image planes, or "slices" of the human body for diagnostic purposes. In such images, moving materials such as flowing blood in the body generally manifest themselves as dark regions of the image. These dark regions can render the images ambiguous, for it may not be possible to positively indentify the dark region as flowing blood or a lesion. Hence, it is desirable to eliminate this source of ambiguity from NMR images. Flowing blood may appear as a dark image region for several reasons. First, liquids such as blood generally exhibit a relatively long longitudinal relaxation time characteristic, termed $T_1$. When the NMR signal parameters are adjusted to cause the relaxation times of other static cellular materials to fall within the center of the brightness range of the image, the relatively long relaxation time of blood will cause the liquid regions of the image to be near the boundary of the brightness range, and conventionally at the black end of the range. This problem can be overcome, however, by adjusting the excitation pulse timing so that long $T_1$ values are located nearer to the middle of the brightness range, where the contrast of liquids such as blood is more meaningful.

A second reason why blood flow appears dark is that blood is generally moving. This means that at the time at which a particle of blood has its phase initially determined it is at one location, but at the time that its emitted NMR signal is detected, or "read", it can be at a different location and may have experienced a different sequence of gradient fields than that which was intended. The changed position and resultant different sequence of gradient effects can shift the phase or frequency of the emitted signal from that which is expected of the particle, rendering the signal uncorrelated with respect to other received signals. In imaging systems which perform slice selection by causing particles within the slice to exhibit Larmor frequencies within a given frequency range, blood flow in excess of 10 cm./sec. will generally accumulate substantial phase errors between the initial phase reference time and the time of data acquisition. The problem is especially significant when two-pulse excitation sequences are used to develop NMR signals, for a significant period of time passes between the time of slice selection and the time of data acquisition following the second excitation pulse. It is desirable, then, to remove these motional effects, particularly when two-pulse excitation sequences are used for NMR imaging.

A further source of undesired motional effect which is not limited to liquids is the motion of a patient's chest due to breathing. The breathing movement of a patient during NMR imaging can create motion artifacts in the representation of both liquid and relatively solid materials in the image of the patient's chest.

In accordance with the principles of the present invention, a technique is provided for producing NMR images which exhibit relatively little sensitivity to motional effects. The effects of motion in a given direction are reduced by applying a gradient pulse sequence in the given direction which exhibits a zero first moment relative to the point in time at which phase determination occurs. In a preferred embodiment of the present invention, imaging gradients that are applied prior to the time of NMR signal acquisition (e.g., phase-encoding gradients) exhibit a zero first moment about the time of the excitation pulse used to translate longitudinal magnetization vectors to the transverse plane. So-called "read" gradients, which are applied during NMR signal acquisition, exhibit a zero first moment at only a single point in time. The effect of the inventive technique is that spins that are moving at a constant velocity have the same phase during readout, or signal acquisition, as they would have if they were not moving at all. If it is desired to cancel the effects of acceleration and deceleration as well as constant velocity, higher order moments of the gradients may also be zeroed.

Figure 1:
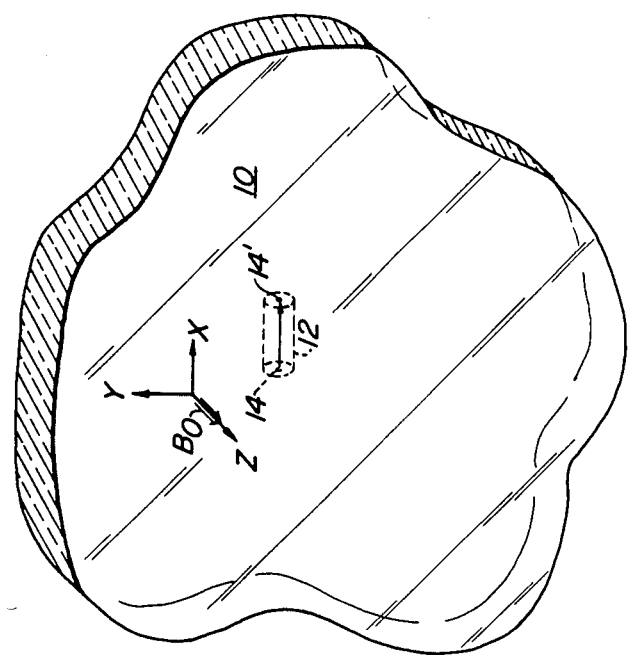
FIG. 1 illustrates a moving particle in an NMR image

Referring to FIG. 1, an NMR image "slice" 10 is shown, which contains a blood vessel 12. The image is resolved in x, y, and z directions with the blood vessel 12 oriented in the x direction. A particle of blood passes through the vessel in the x direction, and at a first point in time is located as shown at 14. At a later point in time, the particle is located at a different position in the x direction, as shown at 14'.

Figure 2:
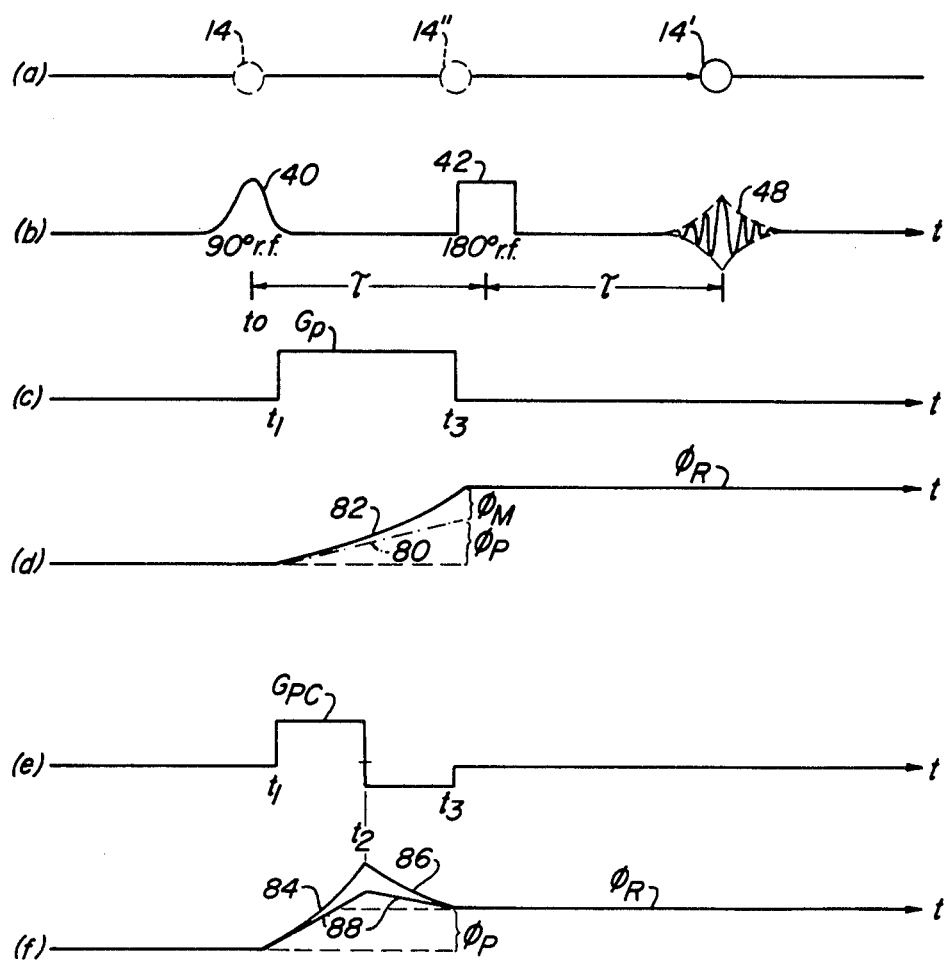
FIG. 2 illustrates the principle of cancellation of motion effects in accordance with the principle of the present invention.

From this simplified representation of a flowing particle, an understanding of the principle of the present invention may be gained by referring to FIG. 2. In FIG. 2a, the particle of FIG. 1 is again represented moving from point 14 to point 14'. As it does so, a two-pulse sequence of NMR excitation signals are applied to the sample in which the particle is moving. The excitation signals are shown in FIG. 2b, including a 90 degree r.f. pulse 40 to tip the magnetization into the transverse plane and establish the reference phase for phase evaluation, and a 180 degree r.f. pulse 42, which refocuses the magnetization and causes a spin-echo 48 to appear.

FIG. 2c represents a phase-encoding gradient pulse $G_p$, applied to the sample during the time interval between excitation pulses 40 and 42. Desirably, the gradient field generated by the $G_p$ pulse should encode the spin-echo signal with a phase which is indicative of the position of the particle at time $t_o$. During the time of the $G_p$ gradient, $t_1$ and $t_3$, the particle should be phase-encoded as indicated by the dotted and dashed line 80, achieving a final phase $\phi_p$. The spin-echo signal would then exhibit a position-representative phase component, $\phi_p$, as shown in FIG. 2d. However, the moving particle moves in the gradient field from time $t_1$ to time $t_3$, and an additional phase component resulting from this motion through the gradient field, $\phi_m$, is also embodied in the phase of the spin-echo signal, with phase-encoding following the generally parabolic line 82. Thus, the resultant phase exhibited by the spin-echo signal 48, $\phi_R$, is a combination of the initial position phase encoding, $\phi_p$, plus the phase change due to motion, $\phi_m$.

FIGS. 2e and 2f illustrate how the unwanted phase change due to particle motion is corrected in accordance with the principles of the present invention. In FIG. 2e, a phase-encoding and correcting pulse $G_{pc}$ is applied to the sample during the time interval $t_1$–$t_3$. During the first portion of this time interval, $t_1$–$t_2$, a phase-encoding gradient field is generated, and the moving particle again begins to produce a phase error due to motion, as indicated by parabolic line 84. However, from time $t_2$ to time $t_3$, a different gradient pulse form is applied, which causes the production of a compensating phase change by the moving particle, as indicated by parabolic line 86. At the end of the gradient interval, time $t_3$, the moving particle has reached position 14" and the motional phase error has been fully compensated, as indicated by the positional phase $\phi_p$ in FIG. 2f. When the spin-echo signal is detected, it will exhibit a phase component $\phi_R$, which is the same as the positional phase-encoding of a stationary particle, $\phi_p$. Thus, the effects of motion upon the detected NMR signal have been removed.

A stationary particle at position 14 will also be correctly phase-encoded by the gradient fields to the proper $\phi_p$, as indicated by line 88 in FIG. 2f.

The pulse form of FIG. 2e is effective for removing motional effects from position encoding because it exhibits a zero value first moment as measured from the effective point in time at which spin phase determination occurs. The effective point in time from which the spin phase are referenced, or are in phase alignment, is at the center of the 90 degree pulse 40 at time $t_o$ in the example of FIG. 2. The first moment of the $G_{pc}$ pulse sequence may be obtained graphically by summing the products of the area under each pulse of the waveform and the respective time interval (moment arm) from $t_o$ to the weighted time center of each pulse. When the result of this summation is zero, the pulse sequence is said to have a zero value first moment.

Figure 3:
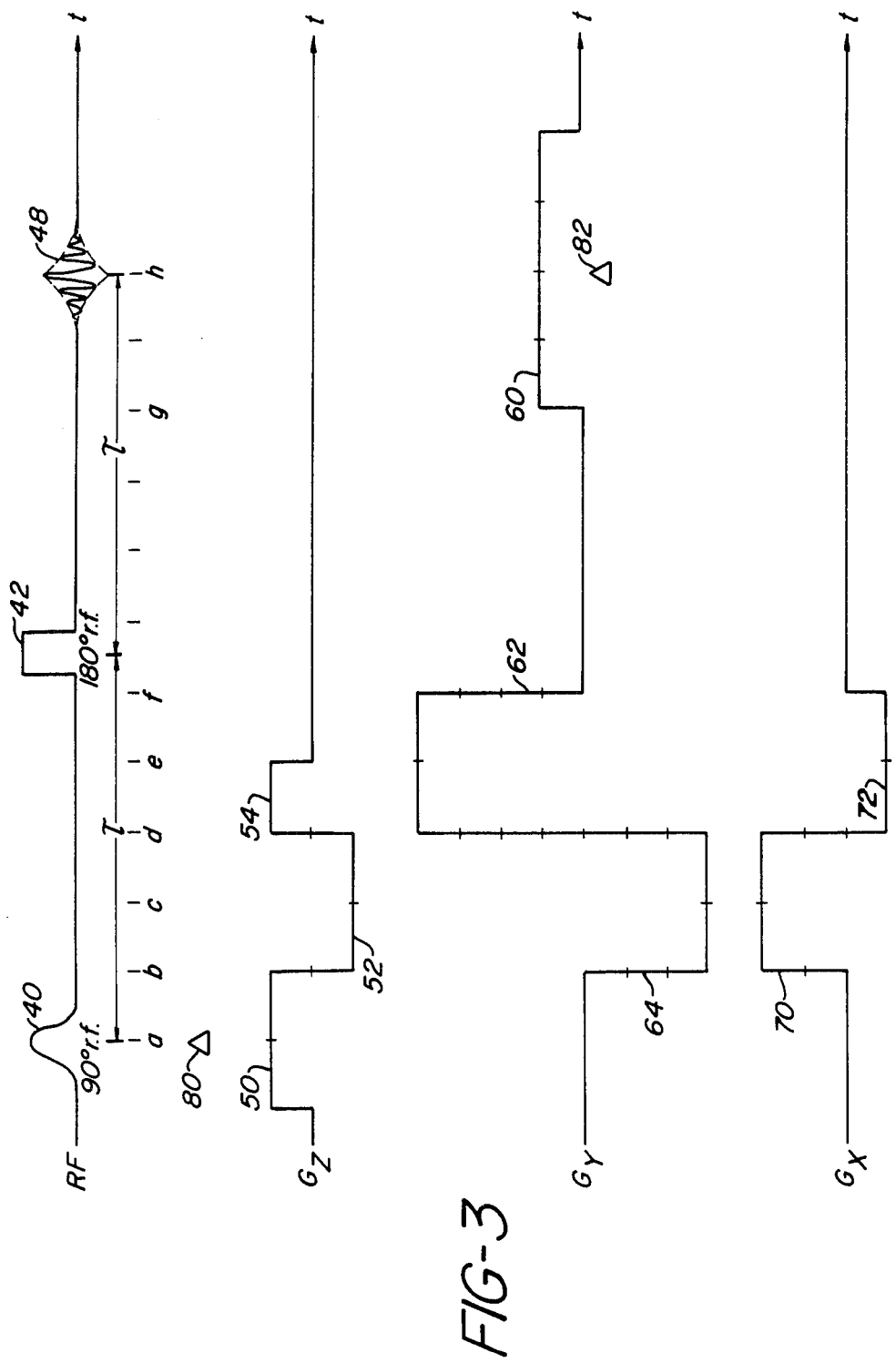
FIG. 3 illustrates the waveforms of an NMR experiment conducted in accordance with the present invention.

When a plurality of different gradients are applied in an NMR imaging experiment, such as conventional $G_x$, $G_y$, and $G_z$ gradients for gradient fields in the x, y and z directions, zeroing the first moment value of any gradient sequence will render the image insensitive to motional effects in the direction of the zeroed gradient. The first moment of one, two, or all gradients may be zeroed, as their effects are independent of each other. Virtually an infinite variety of pulse sequences of various pulse timings and polarities will achieve the desired correction, provided that the criterion of a zero value first moment at the effective point of phase determination for the pulse sequence is satisfied. An example of three gradients which satisfy this criterion is shown in FIG. 3. The RF line of FIG. 3 shows a 90 degree r.f. pulse 40 followed by a 180 degree r.f. pulse 42 after a time interval $\tau$. After a subsequent time interval $\tau$ has elapsed following pulse 42, the spin-echo signal 48 is developed.

Three gradient pulse sequences $G_x$, $G_y$ and $G_z$ are also shown in FIG. 3, all referenced to the same time scale of the RF pulse sequence. This time scale is marked by time reference points a–h. Referring first to the $G_z$ gradient sequence, three pulses, 50, 52, and 54 are shown. The effective point at which the spins are phase determined in the z direction is at point a, at the center of the 90 degree pulse 40. The first moment of the $G_z$ sequence is determined with reference to point a, as indicated by triangle 80. The following expression results:

First Mom.$_a = G_{zab}*(b - a)*(a + b - 2a)/2 +$ $G_{zbd}*(d - b)*(b + d - 2a)/2 + G_{zde}*(e - d)*(d + e - 2a)/2 = 0$ The three lines of this expression refer to pulses 50, 52, and 54, respectively. In each line, the term before the second asterisk is a calculation of pulse area, and the term following the second asterisk is the time interval between the effective point 80 and the pulse center. The notation $G_{klm}$ refers to the amplitude of the $G_k{}^{th}$ gradient pulse (either positive or negative) between times "l" and "m". It may be seen that, in the first line of the expression, only that portion of pulse 50 which occurs between times a and b is included in the calculation; the pulse portion before the effective point 80 plays no part in the moment calculation. With this in mind, it may be seen that the $G_z$ pulse sequence between times a and e also has a zero value zero$^{th}$ moment, which is seen by the fact that positive pulse area (two) equal negative pulse areas in the waveform. For any gradient for which the zero$^{th}$ moment has a zero value, the first moment criterion, once established, holds about any point, which is the case for the illustrated $G_z$ gradient refocusing condition.

The $G_y$ gradient sequence is a "read" sequence, since pulse 60 of the sequence is applied during the time that the spin-echo signal 48 is acquired. In the case of a "read" sequence, only one point in time during the signal acquisition interval meets the zero first moment criterion, and the zero$^{th}$ moment is determined so as to have a zero value at a given desired point in time during signal acquisition. In the illustrated $G_y$ sequence, the zero$^{th}$ and first moments both have zero values at the center of the spin-echo signal, time h, as shown by triangle 82, and as indicated by the following expressions:

Zero Mom.$_a = G_{ybd}*(d - b) + G_{ydf}*(f - d) -$ $G_{ygh}*(h - g) = 0$ at $h$ First Mom.$_a = G_{ybd}*(d - b)*(b + d - 2a)/2 + G_{ydf}*(f -$ $d)*(d + f - 2a)/2 - G_{ygh}*(h - g)*(g + h - 2a)/2 = 0$ at $h$ In each expression, the three lines refer to pulses 64, 62, and 60, respectively, with each line of the zero moment expression being a pulse area computation. The third line of each expression is seen to be preceded by a minus sign. This is because the "read" pulse 60 occurs after the 180 degree pulse 42, which reverses the sign of the effective gradient amplitude, $G_{ygh}$.

The $G_x$ gradient shown in the last line of FIG. 3 differs from the $G_y$ and $G_z$ gradients in that it has a non-zero zero$^{th}$ moment. This is a characteristic of a phase-encoding gradient, and the magnitude of the zero moment is a measurement of the phase-encoding gradient, as pulse area is related to gradient strength. The first moment relation for the $G_x$ gradient waveform is:

$$\text{First Mom.}_a = G_{xbd}*(d - b)*(b + d - 2a)/2 +$$
$$G_{xdf}*(f - d)*(d + f - 2a)/2 = 0$$

The waveforms shown in FIG. 3 may be used in an NMR imaging system such as that shown in FIGS. 1 and 2 of United States patent application numbers (TECH-19), entitled "COMPLEX QUOTIENT NUCLEAR MAGNETIC RESONANCE IMAGING", filed Nov. 9, 1982. The inventive technique for eliminating motional effects advantageously incurs no cost of additional time for signal acquisition, an important consideration in NMR imaging. Indeed, the shorter the duration of the zero value first moment gradient, the greater the reduction of motional effects. This is because a zero value first moment gradient will correct for the effects of constant velocity motion, but not for the effects of changing velocity, or acceleration. If the effects of acceleration are also to be eliminated, higher order moments of the gradient must also be zeroed. But the shorter the gradient duration, the less the time these higher order effects have to manifest themselves. In general, if the gradient duration is of the order of tens of milliseconds, the higher order effects of acceleration will be negligible.

The technique of the present invention finds particularly advantageous application when the effects of motion, or flow, are to be represented in an image, as described in concurrently filed U.S. patent application Ser. No. 551,244, entitled "NUCLEAR MAGNETIC RESONANCE FLOW IMAGING", of which the present inventor is a co-inventor. When the effects of flow in the body are to be imaged, it is desirable to produce an image which is insensitive to motion to be used as a reference against which flow-encoded images can be compared. NMR images produced in accordance with the principles of the present invention have been used for that purpose with good results. An image was produced with a gradient of a selected direction exhibiting a zero value first moment. A second image of the same slice was then taken, with motion or flow in the selected direction encoded and represented in the image. The two images were then compared and used to make a velocity histogram of flow in the selected direction. A Fourier transform performed with respect to the flow encoding of a number of such images produced a sequence of images, each representing a particular flow velocity.

What is claimed is:

1. In an NMR imaging system, a method for acquiring NMR signals which are substantially insensitive to motional effects in a first direction in a sample being imaged comprising the steps of:
   (a) applying an r.f. excitation signal to said sample;
   (b) applying spatially encoding gradients to said sample, with the gradient in said first direction being produced in response to a gradient pulse sequence which exhibits a zero value first moment referenced to a point in time at which phase determination occurs; and
   (c) acquiring NMR signals resulting from said excitation signal and spatially encoding gradients.

2. The method of claim 1, wherein step (b) comprises the step of:
   (b) applying spatially encoding gradients to said sample, with the gradient in said first direction being produced in response to a gradient pulse sequence which exhibits a zero value first moment referenced to the point in time at which the longitudinal magnetization is translated to the transverse plane.

3. The method of claim 2, wherein said gradient pulse sequence also exhibits a zero value zero$^{th}$ moment referenced to said point in time.

4. In an NMR imaging system, a method for producing NMR spin-echo signals which are substantially insensitive to the effects of motion in a first direction in a sample being imaged comprising the steps of:
   (a) applying an r.f. excitation pulse sequence to said sample;
   (b) applying spatially encoding gradients to said sample, with the gradient in said first direction being a frequency-encoding gradient produced in response to a gradient pulse sequence which exhibits a zero value first moment referenced to a point in time at which phase determination occurs for pulses occurring during the time interval between said point in time and a second time occurring during said spin-echo signal.

5. The method of claim 4, wherein said gradient pulse sequence includes a pulse occurring during the time of occurrence of said spin-echo signal.

6. The method of claim 5, wherein said point of time is the time at which the longitudinal magnetization is translated to the transverse plane.

7. The method of claim 6, wherein said second time is substantially equal to the time of occurrence of the peak of said spin-echo signal.

8. The method of claim 7, wherein the portion of said gradient pulse sequence occurring during said time interval exhibits a zero value zero$^{th}$ moment.

9. In an NMR imaging system, a method for acquiring NMR signals which are substantially insensitive to motional effects in a first direction in a sample being imaged comprising the steps of:
   (a) applying an r.f. excitation signal to said sample;
   (b) applying spatially encoding gradients to said sample, with the gradient in said first direction being a phase-encoding gradient produced in response to a gradient pulse sequence which exhibits a zero value first moment referenced to a point in time at which phase determination occurs, and a non-zero value zero$^{th}$ moment; and
   (c) acquiring NMR signals resulting from said excitation signal and spatially encoding gradients.

10. The method of claim 9, wherein said point in time is the time at which the longitudinal magnetization is translated to the transverse plane.

11. A method for preconditioning spatially encoding NMR signals of a moving particle in an NMR sample to substantially eliminate the effects of motion, comprising the steps of:
   (a) applying an r.f. excitation signal to said sample;
   (b) subjecting said particle while it is at a first position to at least a first gradient field in a first direction which provides said particle with position encoding and a first encoded component of a first value which is due to motion;

(c) subjecting said particle while it is at a second, different position to at least a second gradient field in said first direction which provides said particle with a second encoded component of a second value which is due to motion and;

(d) acquiring an NMR signal from said sample, said NMR signal being characterized by a substantial absence of any encoded component resulting from the combined effect of said first and second encoded components which is due to motion.

12. The method of claim 11, wherein said first and second components are phase-encoded components.

* * * * *